United States Patent
Chen et al.

(10) Patent No.: US 11,217,458 B2
(45) Date of Patent: *Jan. 4, 2022

(54) METHOD FOR FORMING SEMICONDUCTOR DEVICE STRUCTURE WITH FINE LINE PITCH AND FINE END-TO-END SPACE

(71) Applicant: Taiwan Semiconductor Manufacturing Co., Ltd., Hsinchu (TW)

(72) Inventors: Hung-Hao Chen, Hsinchu (TW); Yu-Shu Chen, Hsinchu (TW); Yu-Cheng Liu, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 23 days.

This patent is subject to a terminal disclaimer.

(21) Appl. No.: 16/895,525

(22) Filed: Jun. 8, 2020

(65) Prior Publication Data

US 2020/0303204 A1 Sep. 24, 2020

Related U.S. Application Data

(63) Continuation of application No. 15/676,366, filed on Aug. 14, 2017, now Pat. No. 10,679,863, which is a (Continued)

(51) Int. Cl.
*H01L 21/31* (2006.01)
*H01L 21/311* (2006.01)
(Continued)

(52) U.S. Cl.
CPC .... *H01L 21/31144* (2013.01); *H01L 21/0273* (2013.01); *H01L 21/31116* (2013.01); (Continued)

(58) Field of Classification Search
CPC .......... H01L 21/76807; H01L 45/1683; H01L 2221/1015; H01L 2221/1021; (Continued)

(56) References Cited

U.S. PATENT DOCUMENTS 6,593,232 B1  7/2003 Huang et al.
9,349,574 B2  5/2016 Yoshida et al.
(Continued)

FOREIGN PATENT DOCUMENTS

CN  103180932 A  6/2013
JP  2014036139 A  2/2014

OTHER PUBLICATIONS

Mahorowala et al., "Line Edge Roughness Reduction by Plasma Curing Photoresists," IBM T.J. Watson Research Center, Proceedings of SPIE, 2005, vol. 5753, pp. 380-389.

*Primary Examiner* — Moin M Rahman
(74) *Attorney, Agent, or Firm* — Slater Matsil, LLP

(57) ABSTRACT

A method for forming a semiconductor device structure is provided. The method includes providing a substrate and forming a bottom layer, a middle layer, and a top layer on the substrate. The method also includes patterning the top layer to form a patterned top layer and patterning the middle layer by a patterning process including a plasma process to form a patterned middle layer. The plasma process is performed by using a mixed gas including hydrogen gas ($H_2$). The method further includes controlling a flow rate of the hydrogen gas ($H_2$) to improve an etching selectivity of the middle layer to the top layer, and the patterned middle layer includes a first portion and a second portion parallel to the first portion, and a pitch is between the first portion and the second portion.

20 Claims, 10 Drawing Sheets

Related U.S. Application Data continuation of application No. 14/789,337, filed on Jul. 1, 2015, now Pat. No. 9,735,028.

(60) Provisional application No. 62/132,128, filed on Mar. 12, 2015.

(51) Int. Cl.
*H01L 21/027* (2006.01)
*H01L 21/3213* (2006.01)
*H01L 21/768* (2006.01)
*H01L 23/532* (2006.01)

(52) U.S. Cl.
CPC .. *H01L 21/32139* (2013.01); *H01L 21/76811* (2013.01); *H01L 21/76813* (2013.01); *H01L 23/53295* (2013.01)

(58) Field of Classification Search
CPC ..... H01L 2221/1031; H01L 2221/1036; H01L 2224/05006; H01L 2224/05546; H01L 21/768–76898; H01L 23/522–53295; H01L 21/3205–32155; H01L 21/823475; H01L 2221/10–1094; H01L 24/18–25; H01L 2224/18–225; H01L 2224/82–82986; H01L 23/535; H01L 23/5283; H01L 23/53209; H01L 21/76895; H01L 21/76805; H01L 21/76816; H01L 23/53257; H01L 21/76883; H01L 23/53266; H01L 21/76849; H01L 21/76843; H01L 21/7685; H01L 21/31144; H01L 21/76811; H01L 21/76813; H01L 21/32139; H01L 21/31116; H01L 21/0273; H01L 23/53295; H01L 21/76835; H01L 21/76838; H01L 21/28026; H01L 21/823871; H01L 23/552; H01L 25/16; H01L 27/14636; H01L 2224/19; H01L 2224/25; H01L 2225/06541

See application file for complete search history.

(56) References Cited

U.S. PATENT DOCUMENTS

| | | |
|---|---|---|
| 2002/0173157 A1 | 11/2002 | Chang et al. |
| 2004/0084413 A1 | 5/2004 | Aoi |
| 2004/0150110 A1* | 8/2004 | Usami ................. H01L 21/3148 257/756 |
| 2005/0153538 A1 | 7/2005 | Tsai et al. |
| 2005/0242430 A1 | 11/2005 | Lin et al. |
| 2007/0085209 A1 | 4/2007 | Lu et al. |
| 2008/0122101 A1 | 5/2008 | Oku et al. |
| 2008/0182419 A1 | 7/2008 | Yasui et al. |
| 2011/0008959 A1 | 1/2011 | Morgan |
| 2011/0104901 A1 | 5/2011 | Yatsuda et al. |
| 2011/0159699 A1 | 6/2011 | Gabriel |
| 2012/0103939 A1 | 5/2012 | Wu et al. |
| 2014/0126105 A1 | 5/2014 | Kuo et al. |
| 2014/0134848 A1 | 5/2014 | Hisamatsu et al. |
| 2014/0187035 A1 | 7/2014 | Posseme et al. |
| 2015/0163900 A1 | 6/2015 | Nishioka et al. |
| 2015/0279740 A1 | 10/2015 | Roesner et al. |

* cited by examiner

METHOD FOR FORMING SEMICONDUCTOR DEVICE STRUCTURE WITH FINE LINE PITCH AND FINE END-TO-END SPACE

PRIORITY CLAIM AND CROSS-REFERENCE

This Application is a continuation of U.S. patent application Ser. No. 15/676,366, filed on Aug. 14, 2017, entitled "Method for Forming Semiconductor Device Structure with Fine Line Pitch and Fine End-To-End Space," which is a continuation of U.S. patent application Ser. No. 14/789,337, now U.S. Pat. No. 9,735,028, filed on Jul. 1, 2015, entitled "Method for Forming Semiconductor Device Structure with Fine Line Pitch and Fine End-To-End Space," which claims the benefit of U.S. Provisional Application No. 62/132,128, filed on Mar. 12, 2015, and entitled "Method for Forming Semiconductor Device Structure with Fine Line Pitch and Fine End-To-End Space," which applications are incorporated by reference herein in their entireties.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

The size of semiconductor devices has been continuously reduced in the fabrication process in order to increase device density. Accordingly, a multi-layered interconnect structure is provided. The interconnect structure may include one or more conductive lines and via layers.

Although existing interconnect structures and methods of fabricating interconnect structures have been generally adequate for their intended purpose, they have not been entirely satisfactory in all aspects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1B' shows an enlarged view of the region A of FIG. 1B, in accordance with some embodiments of the disclosure.

FIG. 1D' shows an enlarged view of the region B of FIG. 1D, in accordance with some embodiments of the disclosure.

FIG. 1L' shows a perspective view of a semiconductor device structure, in accordance with some embodiments of the disclosure.

DETAILED DESCRIPTION

Figure 1A:
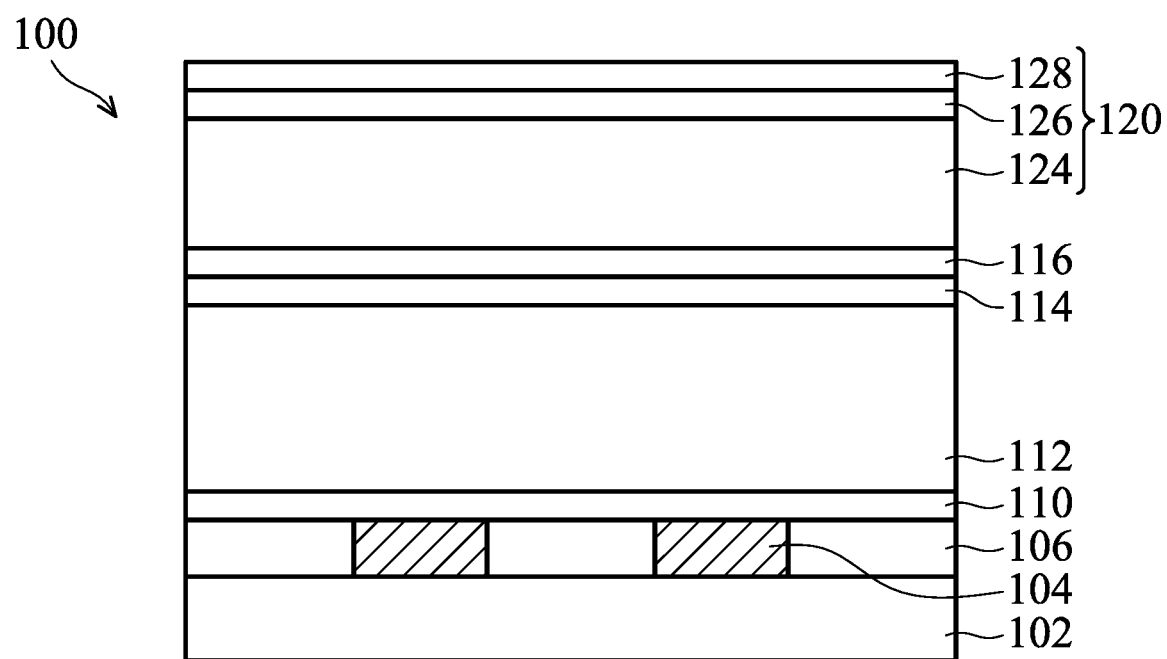
FIGS. 1A-1L show cross-sectional representations of various stages of forming a semiconductor device structure with an interconnect structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Embodiments for forming a semiconductor structure with an interconnect structure are provided. The interconnect structure includes a number of metallization layers formed in a dielectric layer (such as inter-metal dielectric, IMD). One process for forming an interconnect structure is the damascene process. FIGS. 1A-1L show cross-sectional representations of various stages of forming a semiconductor device structure 100 with an interconnect structure, in accordance with some embodiments of the disclosure. FIGS. 1A-1L show a trench-first process for forming a dual damascene structure.

Referring to FIG. 1A, semiconductor device structure 100 includes a substrate 102. Substrate 102 may be made of silicon or other semiconductor materials. Alternatively or additionally, substrate 102 may include other elementary semiconductor materials such as germanium. In some embodiments, substrate 102 is made of a compound semiconductor such as silicon carbide, gallium arsenic, indium arsenide, or indium phosphide. In some embodiments, substrate 102 is made of an alloy semiconductor such as silicon germanium, silicon germanium carbide, gallium arsenic phosphide, or gallium indium phosphide. In some embodiments, substrate 102 includes an epitaxial layer. For example, substrate 102 has an epitaxial layer overlying a bulk semiconductor.

Some device elements (not shown) are formed in substrate 102. Device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements. Various processes are performed to form device elements, such as deposition, etching, implantation, photolithography, annealing, and/or other applicable processes. In some embodiments, device elements are formed in substrate 102 in a front-end-of-line (FEOL) process.

Substrate 102 may include various doped regions such as p-type wells or n-type wells). Doped regions may be doped with p-type dopants, such as boron or $BF_2$, and/or n-type dopants, such as phosphorus (P) or arsenic (As). The doped regions may be formed directly on substrate 102, in a P-well structure, in an N-well structure, or in a dual-well structure.

Substrate 102 may further include isolation features (not shown), such as shallow trench isolation (STI) features or local oxidation of silicon (LOCOS) features. Isolation features may define and isolate various device elements.

As shown in FIG. 1A, a first dielectric layer 106 (such as inter-metal dielectric, IMD) is formed on substrate 102, and a first conductive feature 104 is embedded in first dielectric layer 106. First dielectric layer 106 and first conductive feature 104 are formed in a back-end-of-line (BEOL) process.

First dielectric layer 106 may be a single layer or multiple layers. First dielectric layer 106 is made of s silicon oxide ($SiO_x$), silicon nitride ($Si_xN_y$), silicon oxynitride (SiON), or dielectric material(s) with low dielectric constant (low-k). In some embodiments, first dielectric layer 106 is made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, dielectric layer 106 is deposited by a plasma enhanced chemical vapor deposition (PECVD) process or by a spin coating process.

In some embodiments, first conductive feature 104 is made of copper (Cu), copper alloy, aluminum (Al), aluminum alloy, tungsten (W), tungsten alloy, titanium (Ti), titanium alloy, tantalum (Ta) or tantalum alloy. In some embodiments, first conductive feature 104 is formed by a plating method.

A first etch stop layer 110 is formed on first dielectric layer 106. Etch stop layer 110 may be a single layer or multiple layers. First etch stop layer 110 is made of silicon oxide ($SiO_x$), silicon carbide (SiC), silicon nitride ($Si_xN_y$), silicon carbonitride (SiCN), silicon oxycarbide (SiOC), silicon oxycarbon nitride (SiOCN), or another applicable material. In some embodiments, first etch stop layer 110 has a bi-layer structure which includes a silicon oxide ($SiO_x$) layer formed on a SiC layer, and silicon oxide layer is formed from tetraethyl orthosilicate (TEOS). The SiC layer is used as a glue layer to improve adhesion between the underlying layer and silicon oxide layer.

A second dielectric layer 112 is formed on first etch stop layer 110. Second dielectric layer 112 may be a single layer or multiple layers. Second dielectric layer 112 is made of silicon oxide ($SiO_x$), silicon nitride ($Si_xN_y$), silicon oxynitride (SiON), or dielectric material(s) with low dielectric constant (low-k). In some embodiments, second dielectric layer 112 is made of an extreme low-k (ELK) dielectric material with a dielectric constant (k) less than about 2.5.

A second etch stop layer 114 and a hard mask layer 116 are sequentially formed on second dielectric layer 112. In some embodiments, second etch stop layer 114 is made of nitrogen-free material, such as silicon oxycarbide (SiOC). In some embodiments, hard mask layer 116 is made of a metal material, such as titanium nitride (TiN), tantalum nitride (TaN), or tungsten nitride (WN). Hard mask layer 116 made of metal material is configured to provide a high etching selectivity relative to second dielectric layer 112 during the plasma process.

A tri-layer photoresist structure 120 is formed on hard mask layer 116. Tri-layer photoresist structure 120 includes a bottom layer 124, a middle layer 126 and a top layer 128. In some embodiments, bottom layer 124 is a bottom anti-reflective coating (BARC) layer which is used to reduce reflection during the photolithography process. In some embodiments, bottom layer 124 is made of nitrogen-free material, such as silicon oxynitride (SiON), silicon rich oxide, or silicon oxycarbide (SiOC). In some embodiments, middle layer 126 is made of silicon-based material, such as silicon nitride, silicon oxynitride or silicon oxide.

Top layer 128 may be a positive photoresist layer or a negative photoresist layer. In some embodiments, top layer 128 is made of Poly (methyl methacrylate) (PMMA), Poly (methyl glutarimide) (PMGI), Phenol formaldehyde resin (DNQ/Novolac) or SU-8.

In some embodiments, bottom layer 124 has a thickness in a range from about 80 nm to about 120 nm. In some embodiments, middle layer 126 has a thickness in a range from about 25 nm to about 45 nm. In some embodiments, top layer 128 has a thickness in a range from about 80 nm to about 120 nm.

Afterwards, top layer 128 is patterned to form a patterned top layer 128. Patterned top layer 128 includes a first portion 128a, a second portion 128b, a third portion 128c.

Figure 1B:
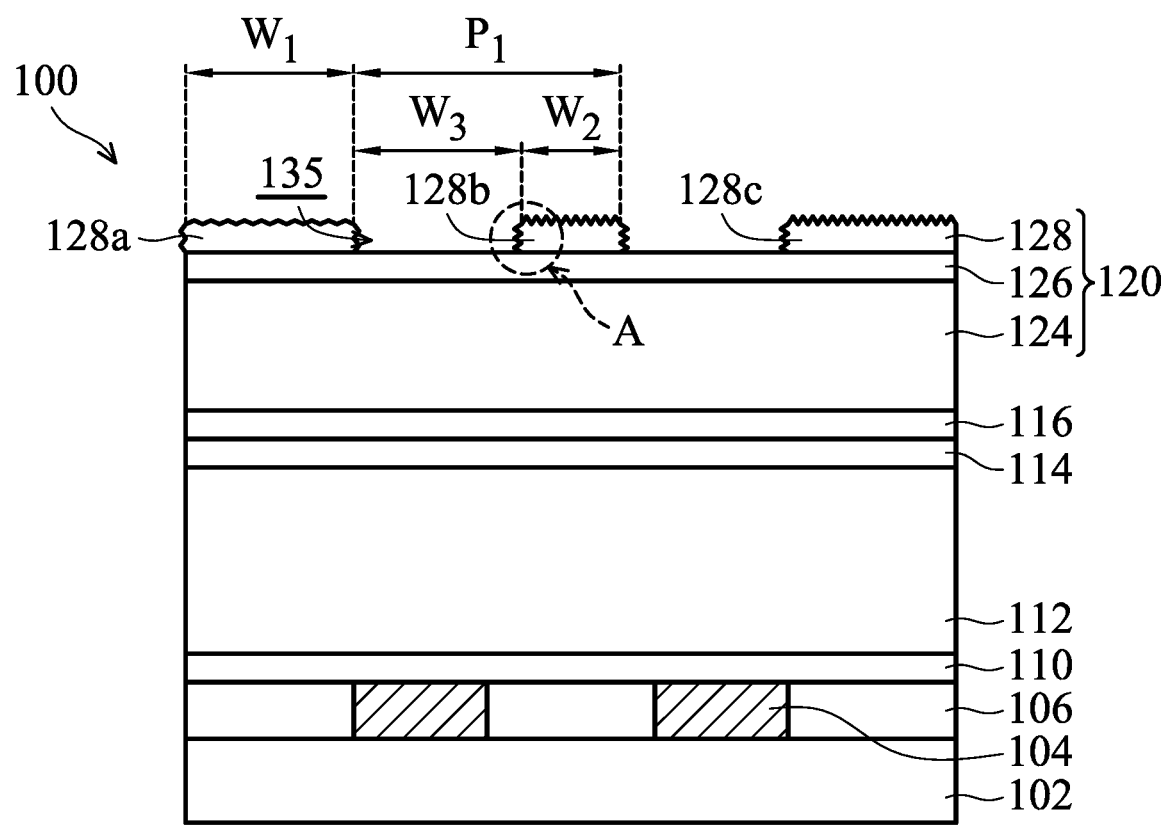
Figure 1B:
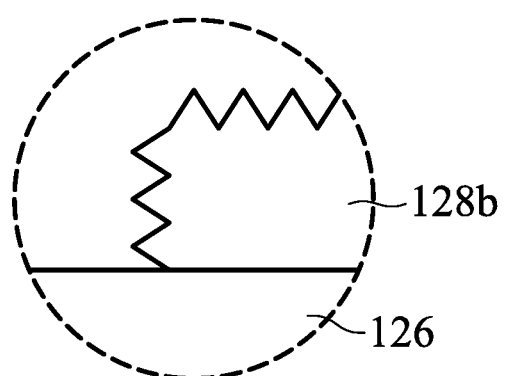

FIG. 1B' shows an enlarged view of the region A of FIG. 1B after top layer 128 is patterned, in accordance with some embodiments of the disclosure.

First portion 128a is parallel to second portion 128b, and second portion 128b is parallel to third portion 128c. Second portion 128b is connected to the third portion 128c by fourth portion (not shown). Specifically, first portion 128a, second portion 128b and third portion 128c are extended along the Y-axis, but fourth portion (not shown) is extended along the X-axis.

As manufacturing technologies for semiconductor devices have developed, the pattern sizes of semiconductor devices have decreased. However, pattern size is limited by the resolution limit of the lithography process used. In some embodiments, during the lithography process, the spatial resolution in the X-direction is different from that in the Y-direction. Therefore, a space between neighboring vertical patterns (or horizontal patterns) may be greater than a predetermined spacing due to the resolution limit of the lithography process.

In addition, because of the resolution limit of the lithography process, some defects ("hot spots", such as shrinkage or distortion) may be produced at some positions which are close to a turning point or a corner of a photoresist layer when the photoresist layer is patterned. In some embodiments, as shown in FIG. 1B', some defects are shown in region A. Once some defects are produced in patterned top layer 128, underlying layers (such as middle layer 126 or bottom layer 124) may also have defects when the underlying layer is patterned by using patterned top layer 128 as a mask. As a result, patterned top layer 128 and underlying layers may be distorted or even broken.

As shown in FIG. 1B, first portion 128a has an ideal pattern and has symmetrical sidewalls. Due to the resolution limit of the lithography process, second portion 128b has an undesirable pattern and has jagged and/or asymmetrical sidewalls. First portion 128a has a first width $W_1$, second portion 128b has a second width $W_2$, and second width $W_2$ is smaller than first width $W_1$. Third portion 128c also has an undesirable pattern which has jagged and/or asymmetrical sidewalls. An opening 135 is formed between first portion 128a and second portion 128b and has a third width $W_3$.

"Line width roughness (LWR)" is a measure of the smoothness of the sidewalls of a linear feature when viewed from the top down. As shown in FIG. 1B', an LWR of first portion 128a is smaller than that of second portion 128b because second portion 128b has asymmetrical sidewalls.

A "pitch" is defined as the distance from one feature to a neighboring feature. As shown in FIG. 1B, first pitch $P_1$ is defined as the distance from first portion 128a to second portion 128b. In some embodiments, first pitch $P_1$ is in a range from about 35 nm to about 120 nm.

Figure 1C:
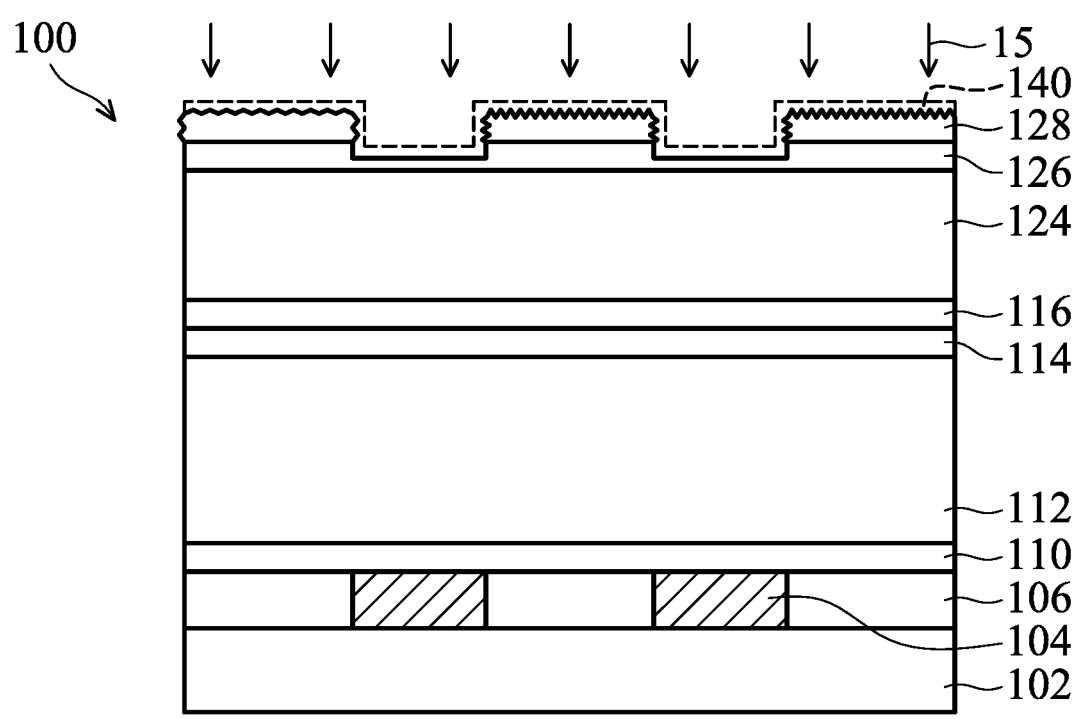
Figure 1D:
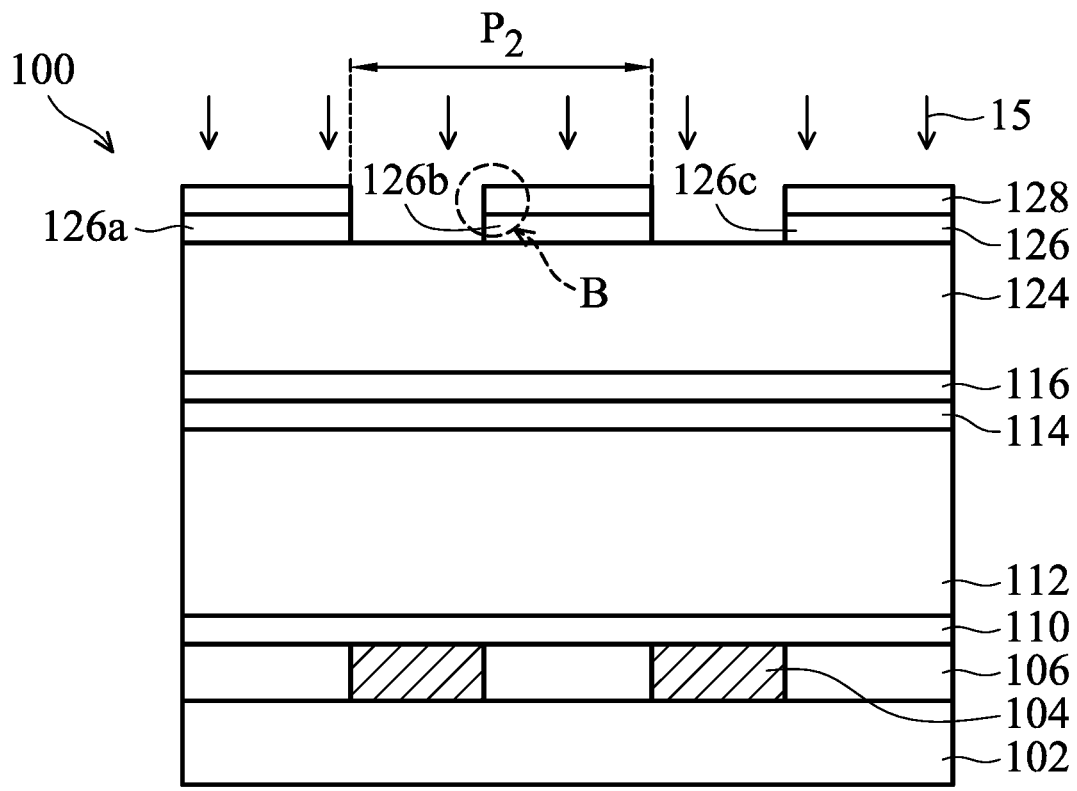
Figure 1D:
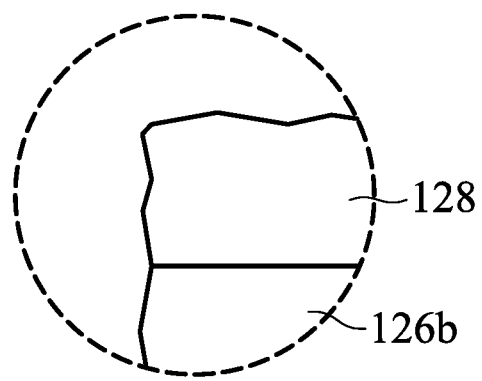

After top layer 128 is patterned, middle layer 126 is patterned by a patterning process as shown in FIG. 1C and FIG. 1D, in accordance with some embodiments of the disclosure. The patterning process includes a photolithography process and an etching process. The etching process is performed by using a first plasma process 15. Photolithography processes include soft baking, mask aligning, exposure, post-exposure baking, developing the photoresist, rinsing and drying (e.g., hard baking).

The first plasma process 15 includes using a mixed gas including hydrogen gas ($H_2$). In addition to hydrogen gas ($H_2$), the mixed gas may further include fluorine-containing gas, inert gas, nitrogen gas ($N_2$) or another applicable gas. In some embodiments, fluorine-containing gas includes nitrogen trifluoride ($NF_3$), sulfur hexafluoride ($SF_6$), hexafluoroethane ($C_2F_6$), tetrafluoromethane ($CF_4$), trifluoromethane ($CHF_3$), difluoromethane ($CH_2F_2$), octofluoropropane ($C_3F_8$), octofluorocyclobutane ($C_4F_8$), or octofluoroisobutylene ($C_4F_8$), fluorine ($F_2$). In some other embodiments, the inert gas includes argon gas (Ar), or helium gas (He).

During first plasma process 15, hydrogen gas is supplied to top layer 128 and middle layer 126. Hydrogen gas is used to adjust the pattern of top layer 128 and middle layer 126. Therefore, the line width roughness (LWR) of patterned top layer 128 is improved by first plasma process 15 with hydrogen gas. In some embodiments, if patterned top layer 128 is not pre-treated by first plasma process 15 with hydrogen gas, the LWR is in a range from about 5 nm to about 9 nm. In some embodiments, after performing first plasma process 15, LWR of patterned top layer 128 is in a range from about 2 nm to about 4 nm.

Hydrogen gas has another function to use as a modified gas to form a protection film 140 on sidewalls and top surfaces of patterned top layer 128 and middle layer 126. In some embodiments, when fluorine-containing gas and hydrogen gas are used, a chemical reaction (I) occurs. Therefore, protection film 140 made of polymer containing CxHyFz is obtained.

 (I)

If no hydrogen gas is used in the first plasma process, the fluorine-containing gas may be the main etching gas to etch the silicon-containing compound. Since middle layer 126 is made of a silicon-containing compound, middle layer 126 will be etched. However, the etching rate of middle layer 126 may be too high. Therefore, in some embodiments, the hydrogen gas in first plasma process 15 is used to adjust the etching rate. When the hydrogen gas is added in first plasma process 15, the hydrogen gas will react with fluorine-containing gas (see chemical reaction (I)), and therefore the etching rate is decreased compared with the first plasma process without using the hydrogen gas. On the other hand, if the amount of the hydrogen gas used in first plasma process 15 is too high, the hydrogen gas may also act like an etching gas to etch middle layer 126. Therefore, the amount of the hydrogen gas should be controlled to obtain the desired pattern.

The flow rate of the hydrogen gas is controlled according to the predetermined etched width. When the flow rate of the hydrogen gas is controlled in different range, different reactions occur. There are three reactions including reactions (a), (b) and (c) in a reaction chamber of the first plasma process 15. In the reaction (a), a fluorine etching reaction occurs which is represented by chemical reactions (II) and (III).

 (II)

 (III)

In the reaction (b), a polymer formation reaction occurs which is represented by chemical reactions (IV) and (V).

 (IV)

 (V)

In the reaction (c), a fluorine formation reaction occurs which is represented by chemical reactions (VI) and (VII).

 (VI)

 (VII)

Figure 2:
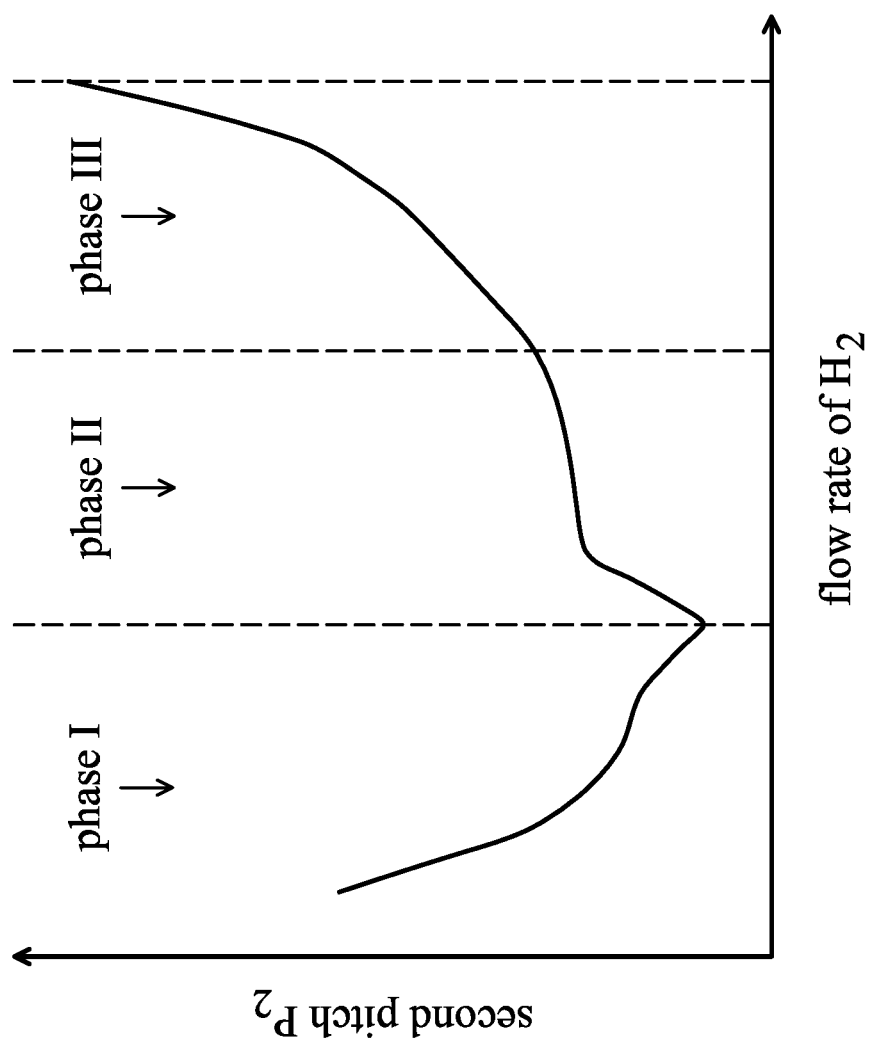
FIG. 2 shows a plot of the first pitch versus the flow rate of hydrogen gas, in accordance with some embodiments of the disclosure.

In some embodiments, the flow rate of the hydrogen gas is controlled within a range of about 0.1 standard cubic centimeters per minute (sccm) to about 300 sccm. The flow rate of the hydrogen gas is divided into three phases including phase I (about 0.1 sccm to about 100 sccm), phase II (about 101 sccm to about 200 sccm) and phase III (about 201 sccm to about 300 sccm). FIG. 2 shows a plot of the second pitch $P_2$ versus the flow rate of hydrogen gas ($H_2$), in accordance with some embodiments of the disclosure. The second pitch $P_2$ is shown in FIG. 1D.

In some embodiments, in the phase I, the reaction (b) is dominate, and the reactions (a) and (c) are subordinate. Therefore, the protection layer 140 is formed on the top surface and sidewall of the top layer 128. The line width roughness (LWR) of patterned top layer 128 is improved. In other words, the pattern of the top layer 128 made of photoresist layer is cured. It should be noted that if the flow rate of the hydrogen gas is smaller than 0.1 sccm, the protection layer 140 is too thin to cure the pattern of the top layer 128. As shown FIG. 2, in the phase I, the second pitch $P_2$ gradually decreases as the flow rate of hydrogen gas increases.

In some embodiments, in the phase II, the reactions (b) and (c) are dominate and they are in balance, and the reaction (a) is subordinate. Therefore, the deposition reaction for forming the protection layer 140 and etching reaction for etching the middle layer 126 occur concurrently. It should be noted that compared with phase I, more amount of fluorine (F) is consumed by hydrogen (H) in phase II. Therefore, a ratio of carbon to fluorine (C/F) in phase II is higher than that in phase I. As shown FIG. 2, in the phase II, the second pitch $P_2$ gradually increases as the flow rate of hydrogen gas increases. For example, in the phase II, the critical dimension (second pitch $P_2$) has an ideal range.

In some embodiments, in the phase III, the reaction (c) is dominate, and the reactions (a) and (b) are subordinate. Therefore, the etching process for etching the middle layer 126 is dominate. It should be noted that if the flow rate of the hydrogen gas is larger than 300 sccm, the top layer 128 may undesirably be etched. As shown FIG. 2, in the phase III, the second pitch $P_2$ gradually increases as the flow rate of hydrogen gas increases. The slope in phase III is greater than the slope in phase II.

In some embodiments, the volume ratio of hydrogen gas to mixed gas in plasma process 15 is in a range from about 3 vol. % to about 60 vol. %. If the flow rate or volume ratio of the hydrogen gas is too low, protection film 140 may be too thick. Therefore, a line width of middle layer 126 that is wider than the predetermined value is obtained. If the flow rate or volume ratio of hydrogen gas is too high, too much of middle layer 126 may be removed. Therefore, a line width of middle layer 126 that is narrower than the predetermined value is obtained.

In some embodiments, first plasma process 15 is a dry etching process and is operated at a pressure in a range from about 5 mTorr to about 20 mTorr. In some embodiments, first plasma process 15 is operated by power in a range from about 400 W to about 1000 W. In some embodiments, first plasma process 15 is operated by bias power in a range from about 50V to about 500V. In some embodiments, first plasma process 15 is operated at a temperature in range from about 20° C. to about 80° C.

Since the hydrogen gas is controlled to remain within a range in first plasma process 15, hydrogen gas also provides another advantage in that the etching selectivity of middle layer 126 is improved. In some embodiments, middle layer 126 has an etching selectivity relative to top layer 128 in a range from about 1.2 to about 100.

In the description above, using the hydrogen gas in first plasma process 15 has several advantages. First, the line width roughness (LWR) of patterned top layer 128 is improved. Second, a protection film 140 is formed on the sidewalls of top layer 128 and middle layer 126 to adjust the shape of top layer 128 and middle layer 126. Third, a predetermined pitch value is obtained by controlling the flow rate of hydrogen gas in a range during first plasma process 15. Fourth, the etching selectivity of middle layer 126 to top layer 128 is improved.

After first plasma process 15, a patterned middle layer 126 is obtained as shown in FIG. 1D, in accordance with some embodiments of the disclosure. It should be noted that, because the shape of top layer 128 is adjusted by first plasma process 15 with hydrogen gas, patterned middle layer 126 has a symmetrical pattern. Patterned middle layer 126 has a first portion 126a, a second portion 126b and a third portion 126c. Second portion 126b is connected to third portion 126c by second portion 126b.

FIG. 1D' shows an enlarged view of the region B of FIG. 1D after middle layer 126 is patterned, in accordance with some embodiments of the disclosure.

As shown in FIG. 1D', patterned middle layer 126 includes first portion 126a, second portion 126b and third portion 126c. Second portion 126b and third portion 126c both have symmetrical patterns. No obvious defects (hot spots) are formed on the sidewalls of second portion 126b and third portion 126c of middle layer 126. First portion 126a is parallel to second portion 126b and is extended along the Y-axis direction. Third portion 126c is parallel to second portion 126b and is extended along the Y-axis direction. Fourth portion (not shown) is perpendicular to third portion 126c and is extended along the X-axis direction. Second portion 126b is connected to third portion 126c a fourth portion (not shown). In some embodiments, a second pitch $P_2$ between first portion 126a and second portion 126b is in a range from about 35 nm to about 120 nm.

Figure 1E:
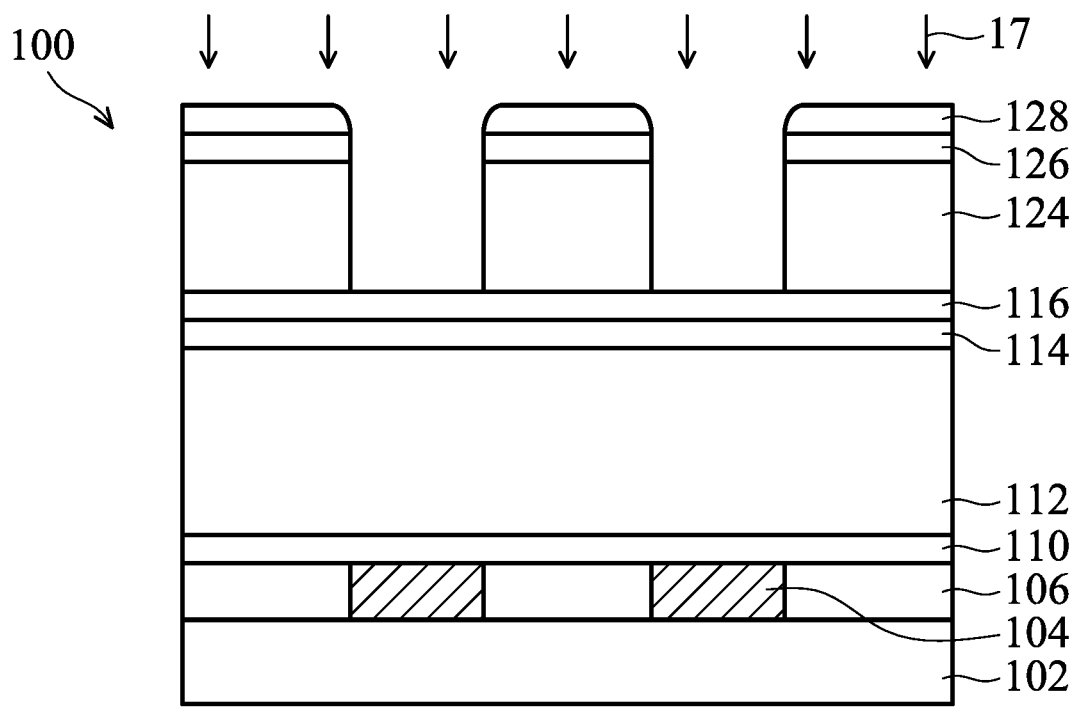

After middle layer 126 is patterned, bottom layer 124 is patterned by using patterned middle layer 126 as a mask, as shown in FIG. 1E, in accordance with some embodiments of the disclosure. In some embodiments, a portion of bottom layer 124 is removed by an etching process 17.

Figure 1F:
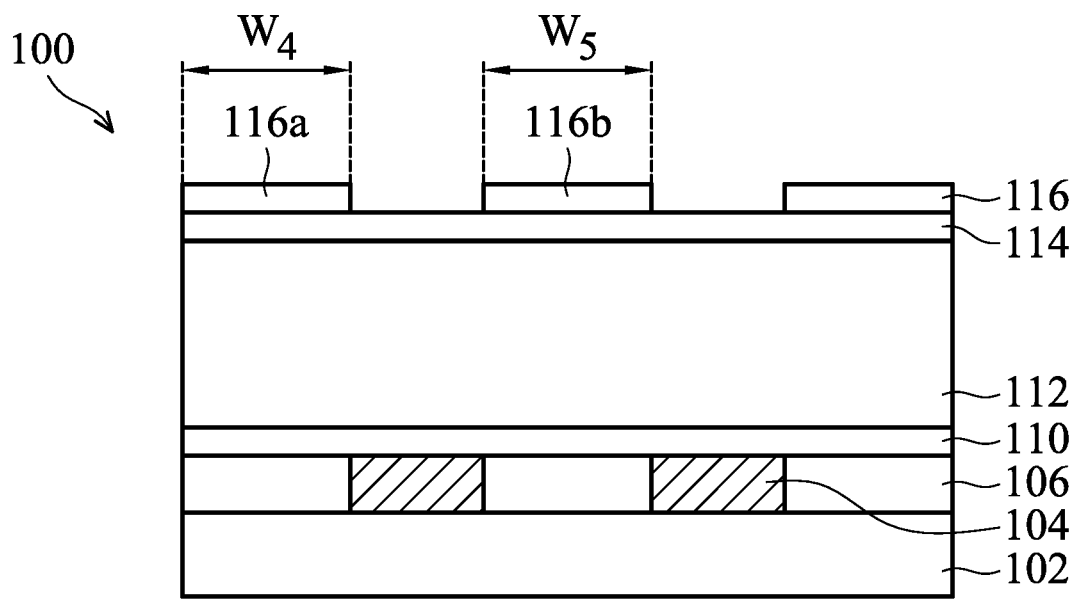

After bottom layer 126 is patterned, hard mask layer 116 is patterned by using patterned top layer 128, patterned middle layer 126 and patterned bottom layer 124 as a mask as shown in FIG. 1F, in accordance with some embodiments of the disclosure. As a result, a patterned hard mask layer 116 is obtained. Patterned hard mask layer 116 includes a first portion 116a with a fourth width $W_4$, and a second portion 116b with a fifth width $W_5$. Fourth width $W_4$ is substantially the same as first width $W_1$ (shown in FIG. 1B), and fifth width $W_5$ is substantially the same as second width $W_2$ (shown in FIG. 1B).

Afterwards, first photoresist structure 120 including top layer 128, middle layer 126 and bottom layer 124 is removed by a number of etching processes, such as wet etching processes or dry etching processes.

Figure 1G:
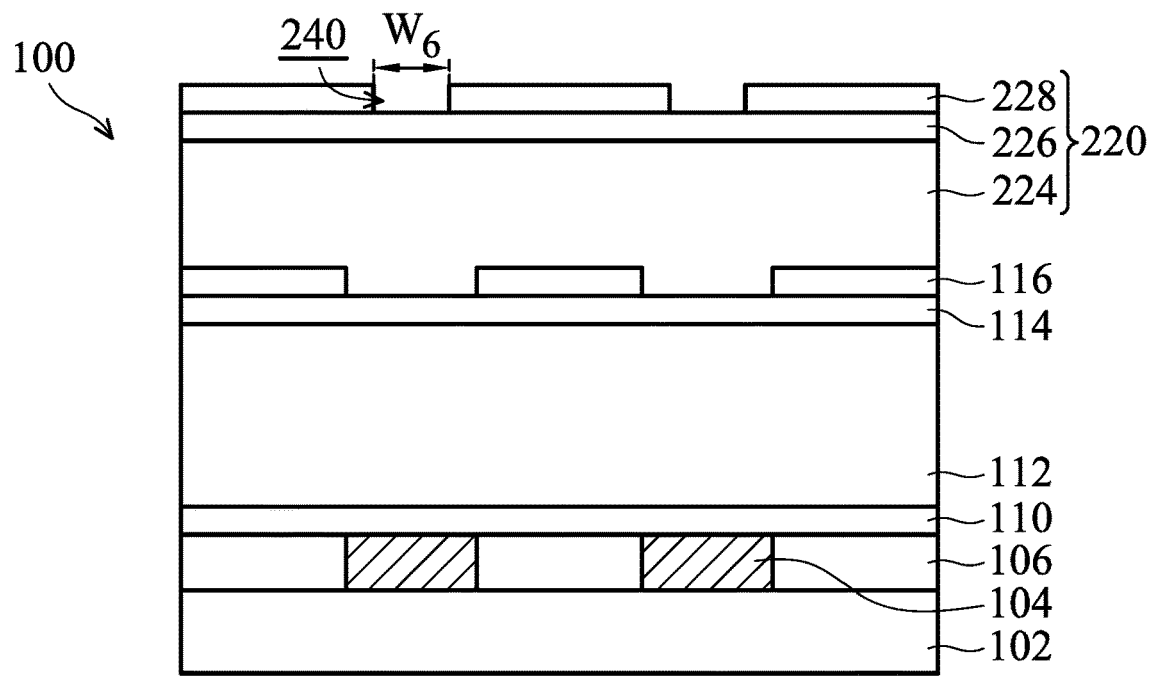

After first photoresist structure 120 is removed, a second photoresist structure 220 is formed on patterned hard mask layer 116 as shown in FIG. 1G, in accordance with some embodiments of the disclosure. Second photoresist structure 220 includes a bottom layer 224, a middle layer 226 and a top layer 228. Top layer 128 is patterned first to form a patterned top layer 228. Patterned top layer 228 has a first opening 240 with a sixth width $W_6$ which is smaller than third width $W_3$ (as shown in FIG. 1B).

Figure 1H:
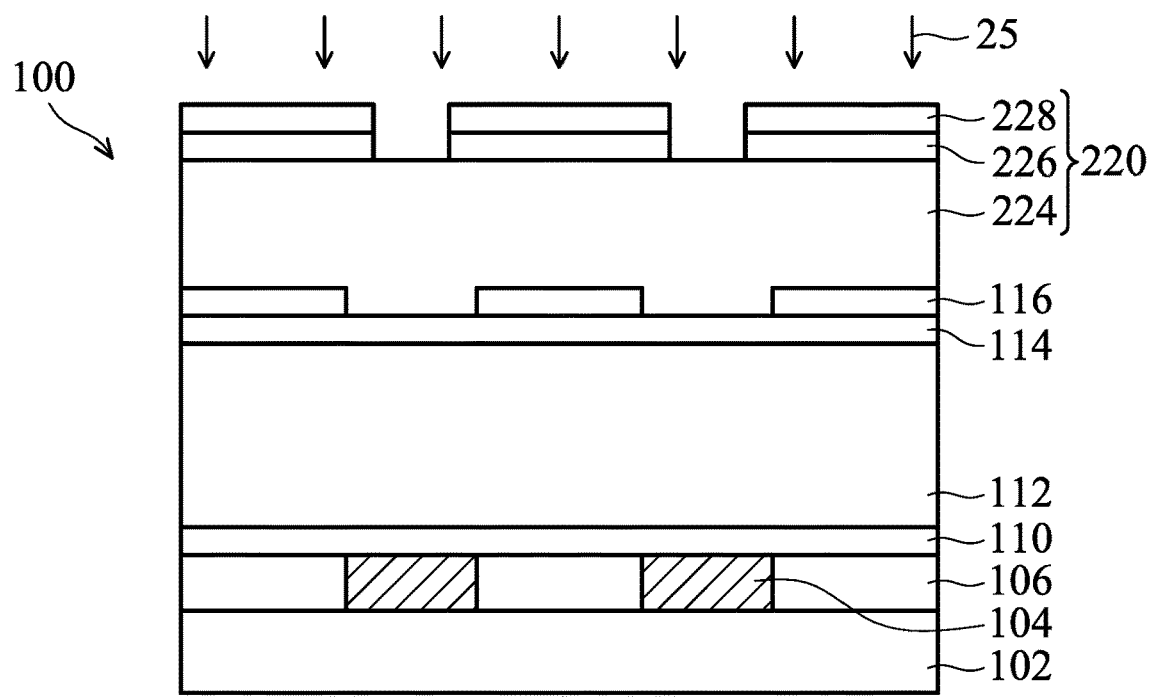

After top layer 228 is patterned, middle layer 226 is patterned by a patterning process including a second plasma process 25 as shown in FIG. 1H, in accordance with some embodiments of the disclosure. Similar to first plasma process 15, second plasma process 25 is performed by using a mixed gas including hydrogen gas. In addition to hydrogen gas, the mixed gas also includes fluorine-containing gas, inert gas, nitrogen gas ($N_2$) or combinations thereof.

As mentioned above, using hydrogen gas in second plasma process 25 has several advantages. First, the line width roughness (LWR) of patterned top layer 228 is improved. Second, a protection film (not shown) is formed on the sidewalls of top layer 228 and middle layer 226 to adjust the shape of top layer 228 and middle layer 226. Third, a predetermined pitch value is obtained by controlling the flow rate of hydrogen gas during second plasma process 25. Fourth, the etching selectivity of middle layer 226 to top layer 228 is improved.

Figure 1I:
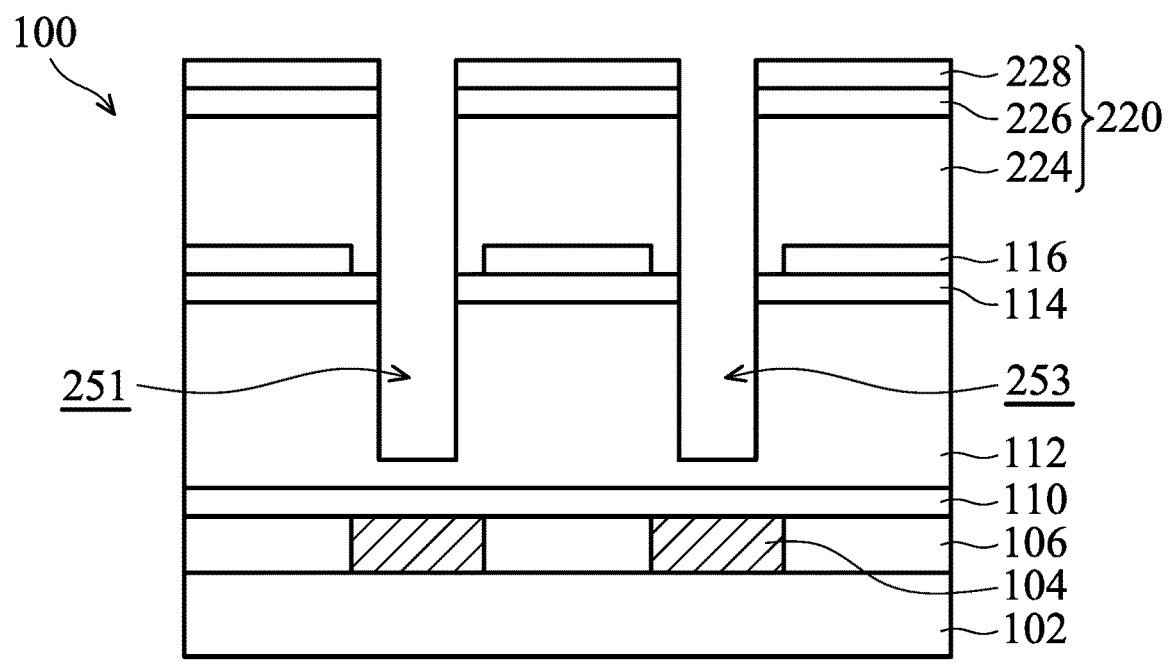

After middle layer 226 is patterned, bottom layer 224, second etch stop layer 114 and second dielectric layer 112 are sequentially removed as shown in FIG. 1I, in accordance with some embodiments of the disclosure. A first via hole 251a and a second via hole 251b are formed in second dielectric layer 112.

Figure 1J:
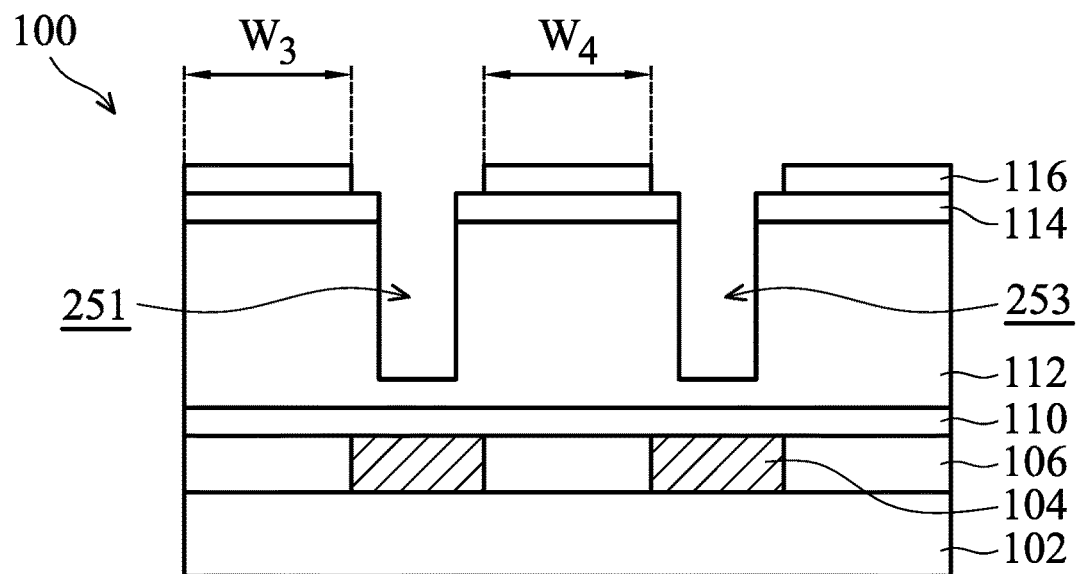

After second dielectric layer 112 is patterned, second photoresist structure 220 is removed as shown in FIG. 1J, in accordance with some embodiments of the disclosure.

Figure 1K:
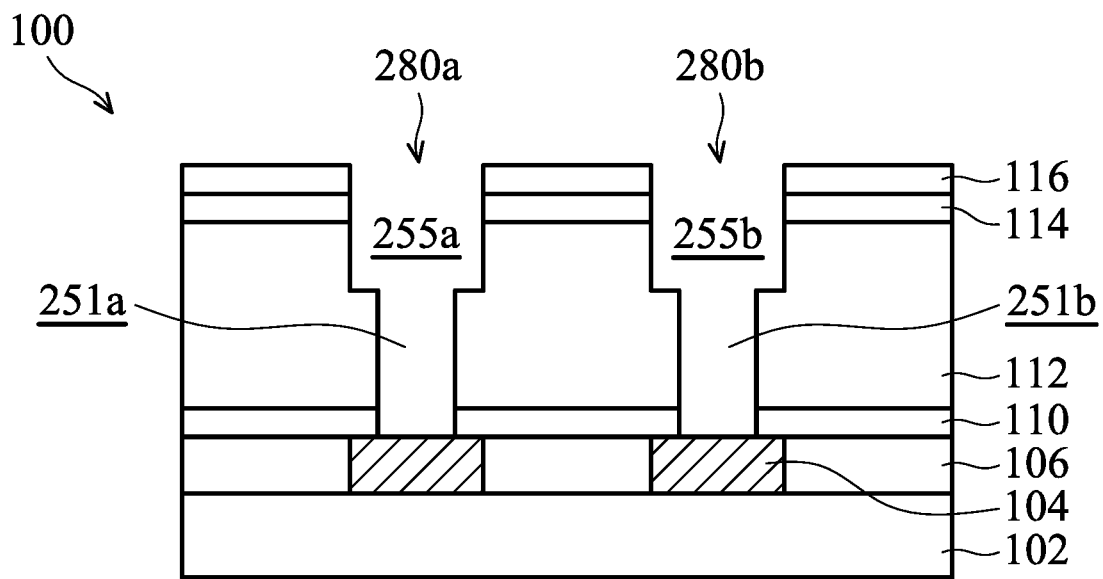

Afterwards, a portion of second etch stop layer 114, a portion of second dielectric layer 112 and a portion of first etch stop layer 110 are removed by using hard mask layer 116 as a mask as shown in FIG. 1K, in accordance with some embodiments of the disclosure. As a result, first conductive feature 104 is exposed.

As shown in FIG. 1K, first via hole 251a and a first trench hole 255a collectively constitute a first trench-via structure 280a for use as a dual damascene cavity. Second via hole 251b and a second trench hole 255b collectively constitute a second trench-via structure 280b for use as a dual damascene cavity.

Afterwards, second etch stop layer 114 and hard mask layer 116 are removed. In some embodiments, second etch stop layer 114 and hard mask layer 116 are removed by a chemical mechanical polishing (CMP) process.

Figure 1L:
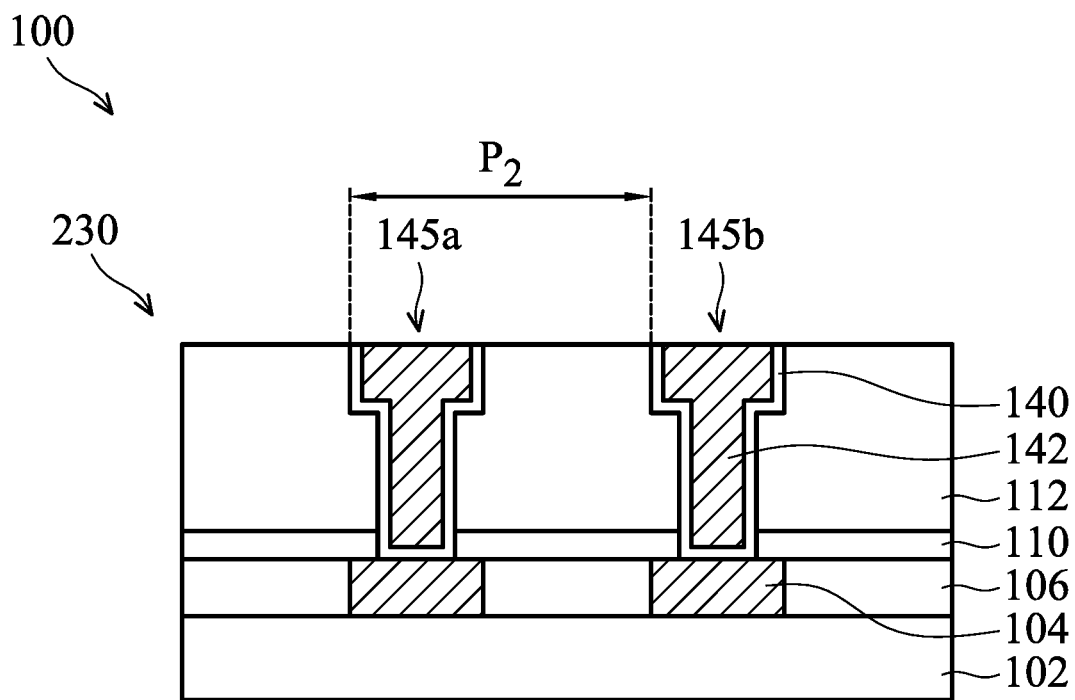
Figure 1L:
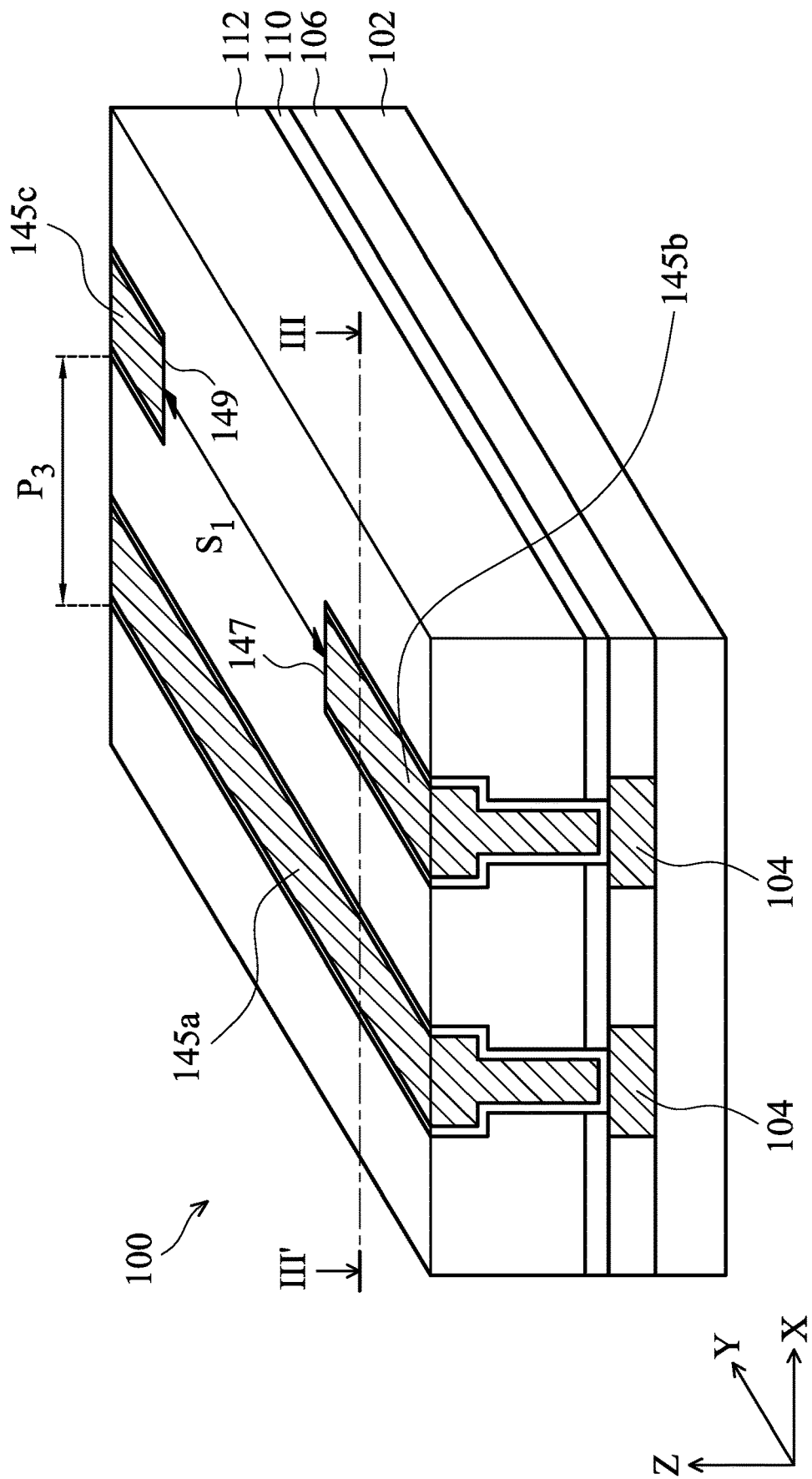

Afterwards, a diffusion barrier layer 140 is formed in first trench-via structure 280a and second trench-via structure 280b, and a second conductive feature 142 is formed on diffusion barrier layer 140 as shown in FIG. 1L, in accordance with some embodiments of the disclosure. In other words, second conductive feature 142 is formed in second dielectric layer 112, and it is surrounded by diffusion barrier layer 140. First conductive structure 145a is formed by filling diffusion barrier layer 140 and second conductive feature 142 in first trench-via structure 280a, and second conductive structure 145b is formed by filling diffusion barrier layer 140 and second conductive feature 142 in second trench-via structure 280b. Second conductive feature 142 is electrically connected to first conductive feature 104. First conductive feature 104 embedded in first dielectric layer 106 and second conductive feature 142 embedded in second dielectric layer 112 form an interconnect structure 230.

In some embodiments, diffusion barrier layer 140 may be made of titanium (Ti), titanium nitride (TiN), tantalum (Ta), tantalum nitride (TaN), or aluminum nitride (AlN). In some embodiments, second conductive feature 142 is made of copper, and diffusion barrier layer 202 includes TaN/Ta bi-layer.

FIG. 1L' shows a perspective view of semiconductor device structure 100, in accordance with some embodiments of the disclosure. FIG. 1L shows a cross-sectional representation along line III-III' of FIG. 1L'.

As shown in FIG. 1L', a third conductive structure 145c is formed in second dielectric layer 112. First conductive structure 145a is parallel to second conductive structure 145b, and first conductive structure 145a is parallel to third conductive structure 145c. Second conductive structure 145b and third conductive structure 145c are formed along the Y-direction. Second conductive structure 145b has a first end 147, third conductive structure 145c has a second end 149, and first end 147 and second end 149 are on opposite sides of second dielectric layer 112. An end-to-end space $S_1$ is defined as the distance between first end 147 and second end 149. A third pitch $P_3$ is defined as the distance from first conductive structure 145a to second conductive structure 145b. In some embodiments, third pitch $P_3$ is in a range from about 70 nm to about 90 nm.

The pattern of second dielectric layer 112 is indirectly obtained by using patterned hard mask layer 116 as a mask, and patterned hard mask 116 is indirectly obtained by using top layer 128 as a mask. If no hydrogen gas is used in first plasma process 15, the pattern of second dielectric layer 112 between first conductive structure 145a and second conductive structure 145b may be damaged or even broken due to some defects in region A of top layer 128 (as shown in FIG. 1B). If the defects in top layer 128 are not repaired, some defects or broken regions may form in second dielectric layer 112 by. Therefore, an undesirable bridge problem may occur because first conductive structure 145a and second conductive structure 145b may connect to each other through broken second dielectric layer 112.

It should be noted that the pattern of top layer 128 is repaired by using a plasma process with hydrogen gas, and therefore middle layer 126 is patterned to have a predetermined pattern. In addition, the flow rate of hydrogen gas is controlled in a range to obtain predetermined pitch $P_3$ and end-to-end spacing $S_3$. In addition, LWR and etching selectivity of middle layer 126 are improved by using plasma process with hydrogen gas.

Afterwards, the processing steps of FIGS. 1A-1L may be repeated to construct a multi-level dual damascene metal interconnect structure (not shown). In some other embodiments, the plasma process with hydrogen gas of the disclosure is applied to form a single damascene structure.

Embodiments for forming a semiconductor device structure and method for formation of the same are provided. An interconnect structure is formed by a number of patterning processes. The patterning process includes using a tri-layer photoresist structure including a top layer, a middle layer, and a bottom layer. The top layer is patterned first to form a patterned top layer. The middle layer is patterned by a plasma process with hydrogen gas. The defects in the patterned top layer are adjusted by the plasma process, and a protection layer is formed on the sidewalls of the top layer and middle layer to compensate for the shape of the top layer. A line width roughness (LWR) of the top layer is improved by the plasma process. The etching selectivity of the middle layer to the top layer is improved by the plasma process. In addition, the flow rate of hydrogen gas is kept within a range to obtain a predetermined pitch and end-to-end spacing. Therefore, the interconnect structure with a smaller pitch and end-to-end spacing is obtained.

In some embodiments, a method for forming a semiconductor device structure is provided. The method includes providing a substrate and forming a bottom layer, a middle layer, and a top layer on the substrate. The method also includes patterning the top layer to form a patterned top layer and patterning the middle layer by a patterning process including a plasma process to form a patterned middle layer. The plasma process is performed by using a mixed gas including hydrogen gas ($H_2$). The method further includes controlling a flow rate of the hydrogen gas ($H_2$) to improve an etching selectivity of the middle layer to the top layer, wherein the patterned middle layer includes a first portion and a second portion parallel to the first portion, and a pitch is between the first portion and the second portion.

In some embodiments, a method for forming a semiconductor device structure is provided. The method includes providing a substrate and forming a dielectric layer on the substrate. The method also includes forming a hard mask layer on the dielectric layer and forming a bottom layer, a middle layer, and a top layer on the hard mask layer. The method also includes patterning the top layer to form a patterned top layer and patterning the middle layer by a patterning process including a plasma process to form a patterned middle layer. The plasma process is performed by using a mixed gas including hydrogen gas ($H_2$). The method includes patterning the bottom layer to form a patterned bottom layer and patterning the hard mask layer by using the patterned top layer, the patterned middle layer, and patterned bottom layer as a mask to form a patterned hard mask layer.

In some embodiments, a method for forming a semiconductor device structure is provided. The method includes providing a substrate and forming a dielectric layer on the substrate. The method also includes forming a hard mask layer on the dielectric layer and forming a bottom layer, a middle layer, and a top layer on the hard mask layer, and the middle layer is made of a silicon-containing compound. The method includes patterning the top layer to form a patterned top layer and performing a plasma process on the top layer to improve the line width roughness (LWR) of the top layer. The plasma process includes using a mixed gas including hydrogen gas ($H_2$). The method includes continuously performing the plasma process to the middle layer to form a protection film on the sidewalls of the top layer and the sidewalls of the middle layer, and continuously performing the plasma process on the middle layer to remove a portion of the middle layer to form a patterned middle layer. The method includes patterning the bottom layer to form a patterned bottom layer and patterning the hard mask layer by using the patterned top layer, the patterned middle layer, and the patterned bottom layer as a mask to form a patterned hard mask layer.

In some embodiments, a method includes forming a tri-layer mask over a substrate, forming an opening in a top layer of the tri-layer mask, and performing a plasma process on the top layer and a middle layer of the tri-layer mask, where the plasma process is performed using a mixed gas comprising hydrogen gas ($H_2$). Performing the plasma process includes extending the opening into the middle layer of the tri-layer mask to form an extended opening, and depositing a protection layer on sidewalls of the extended opening. The method further includes performing an etch process on a bottom layer of the tri-layer mask by using the middle layer of the tri-layer mask as a mask.

In some embodiments, a method includes forming a hard mask layer over a dielectric layer, forming a bottom layer, a middle layer, and a top layer on the hard mask layer, patterning the top layer to form a patterned top layer, and performing a plasma process on the patterned top layer and the middle layer, where the plasma process is performed using a mixed gas comprising hydrogen gas ($H_2$). Performing the plasma process includes reducing a line width roughness (LWR) of the patterned top layer, patterning the middle layer to form a patterned middle layer, and depositing a protection film on sidewalls of the patterned top layer and sidewalls of the patterned middle layer. The method further includes patterning the bottom layer by using the patterned middle layer as a mask to form a patterned bottom layer, and patterning the hard mask layer by using the patterned top layer, the patterned middle layer, and the patterned bottom layer as a mask to form a patterned hard mask layer.

In some embodiments, a method includes forming a dielectric layer over a substrate, forming a hard mask layer over the dielectric layer, forming a bottom layer, a middle layer, and a top layer on the hard mask layer, patterning the top layer to form a patterned top layer, and performing a plasma process on the patterned top layer and the middle layer, where the plasma process is performed using a mixed gas comprising hydrogen gas ($H_2$). Performing the plasma process includes etching the middle layer to form a patterned middle layer, increasing an etching selectivity of the middle layer relative to the top layer by controlling a flow rate of the hydrogen gas ($H_2$), and depositing a protection film on sidewalls of the patterned top layer and sidewalls of the patterned middle layer. The method further includes etching the bottom layer by using the patterned middle layer as a mask to form a patterned bottom layer, and etching the hard mask layer by using the patterned top layer, the patterned middle layer, and the patterned bottom layer as a mask to form a patterned hard mask layer.

In some embodiments, a method includes forming a tri-layer mask over a substrate, forming an opening in a top layer of the tri-layer mask, and performing a plasma process on the top layer and a middle layer of the tri-layer mask. The plasma process is performed using a mixed gas comprising molecular hydrogen gas ($H_2$). Performing the plasma process includes extending, using a plasma generated from the mixed gas, the opening into the middle layer of the tri-layer mask to form an extended opening, increasing an etching selectivity of the middle layer relative to the top layer by controlling a flow rate of the molecular hydrogen gas ($H_2$), and depositing, using the plasma generated from the mixed gas, a protection layer on sidewalls and a bottom of the extended opening, wherein the protection layer comprises $C_xH_yF_z$. Each of x, y and z is greater than zero.

In some embodiments, a method includes forming a hard mask layer over a dielectric layer, forming a bottom layer, a middle layer, and a top layer on the hard mask layer, patterning the top layer to form a patterned top layer, and performing a plasma process on the patterned top layer and the middle layer. The plasma process is performed using a mixed gas comprising hydrogen gas ($H_2$). Performing the plasma process includes reducing a line width roughness (LWR) of the patterned top layer, patterning the middle layer to form a patterned middle layer, and depositing a protection film on sidewalls of the patterned top layer and sidewalls of the patterned middle layer.

In some embodiments, a method includes forming a dielectric layer over a substrate, forming a hard mask layer over the dielectric layer, forming a bottom layer, a middle layer, and a top layer on the hard mask layer, patterning the top layer to form a patterned top layer, and performing a plasma process on the patterned top layer and the middle layer. The plasma process is performed using a mixed gas comprising hydrogen gas ($H_2$). Performing the plasma process includes etching the middle layer to form a patterned middle layer, increasing an etching selectivity of the middle layer relative to the top layer by controlling a flow rate of the hydrogen gas ($H_2$), and depositing a protection film on sidewalls of the patterned top layer and sidewalls of the patterned middle layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a tri-layer mask over a substrate;
    forming an opening in a top layer of the tri-layer mask; and
    performing a plasma process on the top layer and a middle layer of the tri-layer mask, wherein the plasma process is performed using a mixed gas comprising molecular hydrogen gas ($H_2$), and wherein performing the plasma process comprises:
        extending, using a plasma generated from the mixed gas, the opening into the middle layer of the tri-layer mask to form an extended opening;
        increasing an etching selectivity of the middle layer relative to the top layer by controlling a flow rate of the molecular hydrogen gas ($H_2$); and
        depositing, using the plasma generated from the mixed gas, a protection layer on sidewalls and a bottom of the extended opening, wherein the protection layer comprises $C_xH_yF_z$, and wherein each of x, y and z is greater than zero.

2. The method of claim 1, further comprising performing an etch process on a bottom layer of the tri-layer mask by using the middle layer of the tri-layer mask as a mask.

3. The method of claim 1, wherein performing the plasma process further comprises reducing a roughness of a sidewall of the opening.

4. The method of claim 1, wherein the flow rate of the molecular hydrogen gas ($H_2$) is between about 0.1 sccm to about 300 sccm.

5. The method of claim 1, wherein the etching selectivity of the middle layer of the tri-layer mask relative to the top layer of the tri-layer mask is between about 1.2 to about 100.

6. The method of claim 1, wherein a volume ratio of the molecular hydrogen gas ($H_2$) to the mixed gas is between about 3 vol % and about 60 vol %.

7. The method of claim 1, wherein the mixed gas further comprises a fluorine-containing gas.

8. The method of claim 7, wherein the mixed gas further comprises an inert gas.

9. A method comprising:

forming a hard mask layer over a dielectric layer; forming a bottom layer, a middle layer, and a top layer on the hard mask layer; patterning the top layer to form a patterned top layer; and performing a plasma process on the patterned top layer and the middle layer, wherein the plasma process is performed using a mixed gas comprising hydrogen gas ($H_2$), and wherein performing the plasma process comprises: reducing a line width roughness (LWR) of the patterned top layer; patterning the middle layer to form a patterned middle layer; and depositing a protection film on sidewalls of the patterned top layer and sidewalls of the patterned middle layer, wherein the protection layer comprises $C_xH_yF_z$, and wherein each of x, y and z is greater than zero.

10. The method of claim 9, further comprising:

patterning the bottom layer by using the patterned middle layer as a mask to form a patterned bottom layer; and
patterning the hard mask layer by using the patterned top layer, the patterned middle layer, and the patterned bottom layer as a mask to form a patterned hard mask layer.

11. The method of claim 9, wherein, after performing the plasma process, the LWR of the patterned top layer is between about 2 nm and about 4 nm.

12. The method of claim 9, wherein performing the plasma process further comprises increasing an etching selectivity of the middle layer relative to the top layer by controlling a flow rate of the hydrogen gas ($H_2$).

13. The method of claim 9, wherein the bottom layer comprises an anti-reflective coating (BARC) layer.

14. The method of claim 9, wherein the top layer comprises a photoresist material.

15. A method comprising:

forming a dielectric layer over a substrate; forming a hard mask layer over the dielectric layer; forming a bottom layer, a middle layer, and a top layer on the hard mask layer; patterning the top layer to form a patterned top layer; and performing a plasma process on the patterned top layer and the middle layer, wherein the plasma process is performed using a mixed gas comprising hydrogen gas ($H_2$), and wherein performing the plasma process comprises; etching the middle layer to form a patterned middle layer; increasing an etching selectivity of the middle layer relative to the top layer by controlling a flow rate of the hydrogen gas ($H_2$); and depositing a protection film on sidewalls of the patterned top layer and sidewalls of the patterned middle layer, wherein the protection layer comprises $C_xH_yF_z$, and wherein each of x, y and z is greater than zero.

16. The method of claim 15, further comprising:

etching the bottom layer by using the patterned middle layer as a mask to form a patterned bottom layer; and
etching the hard mask layer by using the patterned top layer, the patterned middle layer, and the patterned bottom layer as a mask to form a patterned hard mask layer.

17. The method of claim 15, wherein performing the plasma process further comprises reducing a line width roughness (LWR) of the patterned top layer.

18. The method of claim 15, wherein the etching selectivity of the middle layer relative to the top layer is between about 1.2 to about 100.

19. The method of claim 15, wherein a thickness of the middle layer is less than a thickness of the top layer and a thickness of the bottom layer.

20. The method of claim 9, wherein the middle layer comprises a silicon-based material.

* * * * *